US012672525B2

(12) United States Patent
Lottes et al.

(10) Patent No.: US 12,672,525 B2
(45) Date of Patent: Jun. 30, 2026

(54) METHODS OF MANUFACTURING SEMICONDUCTOR-ON-INSULATOR WAFERS HAVING CHARGE TRAPPING LAYERS WITH CONTROLLED STRESS

(71) Applicant: GlobalWafers Co., Ltd., Hsinchu (TW)

(72) Inventors: Charles R. Lottes, Ballwin, MO (US);
Jeffrey L Libbert, O'Fallon, MO (US);
Qingmin Liu, Glen Carbon, IL (US)

(73) Assignee: GlobalWafers Co., Ltd., Hsinchu (TW)

( * ) Notice: Subject to any disclaimer, the term of this patent is extended or adjusted under 35 U.S.C. 154(b) by 564 days.

(21) Appl. No.: 18/162,951

(22) Filed: Feb. 1, 2023

(65) Prior Publication Data

US 2024/0258155 A1 Aug. 1, 2024

(51) Int. Cl.
*H10P 90/00* (2026.01)
*H10W 10/10* (2026.01)

(52) U.S. Cl.
CPC ....... *H10P 90/1914* (2026.01); *H10W 10/181* (2026.01)

(58) Field of Classification Search
CPC ......... H01L 21/76251; H01L 21/02502; H01L 21/02002; H01L 21/02529; H01L 21/02532; H01L 21/0262; H01L 21/02447; H01L 21/0245; H01L 21/02381; H01L 21/76254; H10P 90/1914; H10P 90/1916; H10P 90/1904; H10P 90/1918; H10P 14/24; H10P 14/3248; H10P 14/2905; H10P 14/3408; H10P 14/3411; H10P 14/3208; H10P 14/3211; H10W 10/181
See application file for complete search history.

(56) References Cited

U.S. PATENT DOCUMENTS

| | | | | |
|---|---|---|---|---|
| 7,968,438 B2 * | 6/2011 | Han | .................... | H01L 21/0245 |
| | | | | 257/E21.129 |
| 9,209,069 B2 * | 12/2015 | Libbert | ............. | H01L 21/76254 |
| 9,768,056 B2 | 9/2017 | Peidous et al. | | |
| 10,283,402 B2 | 5/2019 | Wang et al. | | |
| 10,546,771 B2 | 1/2020 | Wang et al. | | |
| 11,239,107 B2 | 2/2022 | Wang et al. | | |
| 2005/0142817 A1 * | 6/2005 | Sohn | ................. | H01L 21/02422 |
| | | | | 438/795 |
| 2018/0114720 A1 * | 4/2018 | Wang | ............... | H01L 21/02381 |

* cited by examiner

*Primary Examiner* — Dale E Page
*Assistant Examiner* — Quovaunda Jefferson
(74) *Attorney, Agent, or Firm* — Armstrong Teasdale, LLP

(57) ABSTRACT

A method of preparing a multilayer structure includes providing a single crystal semiconductor handle substrate that includes a front surface, a back surface, a circumferential edge joining the front and back surfaces, and a central plane between the front and back surfaces. The single crystal semiconductor handle substrate has a minimum bulk region resistivity of at least about 500 Ohm-cm. The method also includes depositing a semiconductor layer on the front surface of the single crystal semiconductor handle substrate. Depositing the semiconductor layer is performed by two or more cycles of depositing a portion of the semiconductor layer and interrupting the deposition after the portion of the semiconductor layer has been deposited to anneal the portion of the semiconductor layer.

18 Claims, 8 Drawing Sheets

METHODS OF MANUFACTURING SEMICONDUCTOR-ON-INSULATOR WAFERS HAVING CHARGE TRAPPING LAYERS WITH CONTROLLED STRESS

THE FIELD OF THE DISCLOSURE

The present disclosure generally relates to the field of semiconductor wafer manufacture. More specifically, the present disclosure relates to a method of preparing a handle substrate for use in the manufacture of a semiconductor-on-insulator (e.g., silicon-on-insulator) structure, and more particularly to a method for producing a polycrystalline semiconductor layer on the handle wafer of the semiconductor-on-insulator structure, in which the stress in the polycrystalline semiconductor layer is controlled without creating crystallographic slip defects in the handle wafer.

BACKGROUND

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally includes a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates, and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer may be activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor wafer and handle wafer hydrophilic. The wafers are then pressed together, and a bond is formed there between. This bond may be relatively weak, and may be strengthened before further processing occurs.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (e.g., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method may facilitate better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for radiofrequency (RF) related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm, or greater than about 1000 Ohm-cm. With reference now to FIG. 1, a silicon on insulator structure 2 including a very high resistivity silicon wafer 4, a buried oxide (BOX) layer 6, and a silicon device layer 10 is shown. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency (RF) devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999: D. Lederer, R. Lobet and J.-P. Raskin, "Enhanced high resistivity SOI wafers for RF applications," *IEEE Intl. SOI Conf.*, pp. 46-47, 2004: D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005: D. Lederer, B. Aspar, C. Laghaé and J.-P. Raskin, "Performance of RF passive structures and SOI MOSFETS transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

BRIEF SUMMARY

Embodiments disclosed herein include methods of manufacturing semiconductor-on-insulator (e.g., silicon-on-insulator) wafers having a semiconductor charge trapping layer deposited onto a semiconductor handle substrate, in which the stress in the semiconductor charge trapping layer is controlled without creating crystallographic slip defects in the handle wafer. Suitably, the stress in the semiconductor charge trapping layer is controlled such that compressive stress induced by the deposition of the semiconductor charge trapping layer transitions to tensile stress. The methods described herein may include annealing the semiconductor charge trapping layer at relatively low temperatures. The anneal may take place intermittently during the deposition of the semiconductor charge trapping layer, where the deposition is paused after a portion thereof has been deposited and the deposited portion is annealed. The deposited portion may be annealed at an anneal temperature that is near or substantially equal to a deposition temperature.

In one aspect, a method of preparing a multilayer structure is provided. The method includes providing a single crystal semiconductor handle substrate. The single crystal semiconductor handle substrate includes two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane between the front and back surfaces of the single crystal semiconductor handle substrate. The single crystal semiconductor handle substrate has a minimum bulk region resistivity of at least about 500 Ohm-cm. The method also includes depositing a semiconductor layer on the front surface of the single crystal semiconductor handle substrate. Depositing the semiconductor layer is performed by two or more cycles of depositing a portion of the semiconductor layer and interrupting the deposition after the portion of the semiconductor layer has been deposited to anneal the portion of the semiconductor layer.

In another aspect, a method of preparing a multilayer structure is provided. The method includes providing a single crystal semiconductor handle substrate. The single crystal semiconductor handle substrate includes two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane between the front and back surfaces of the single crystal semiconductor handle substrate. The single crystal semiconductor handle substrate has a minimum bulk region resistivity of at least about 500 Ohm-cm. The method also includes depositing a polycrystalline semiconductor seed layer on the front surface of the single crystal semiconductor handle substrate and annealing the polycrystalline semiconductor seed layer. The method also includes depositing a first layer of polycrystalline semiconductor material on the annealed polycrystalline semiconductor seed layer at a deposition temperature and annealing the first layer of polycrystalline semiconductor material at a temperature that is less than a temperature at which the polycrystalline semiconductor seed layer is annealed.

Other advantages and features of the embodiments disclosed herein will be in part apparent and in part pointed out hereinafter.

DETAILED DESCRIPTION

Figure 1:
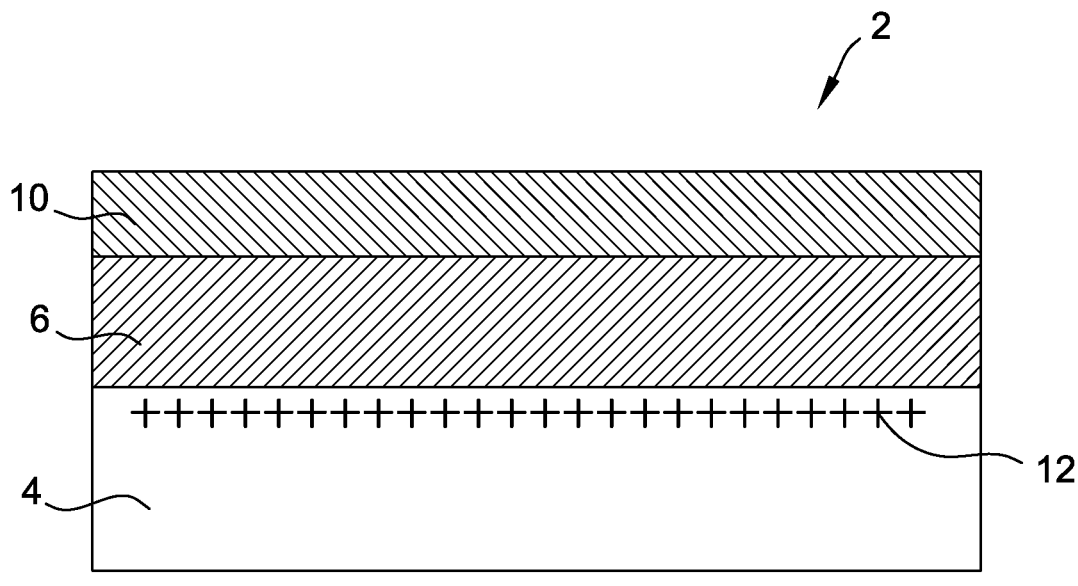
FIG. 1 is a depiction of a silicon-on-insulator wafer comprising a high resistivity substrate and a buried oxide layer.
Figure 2:
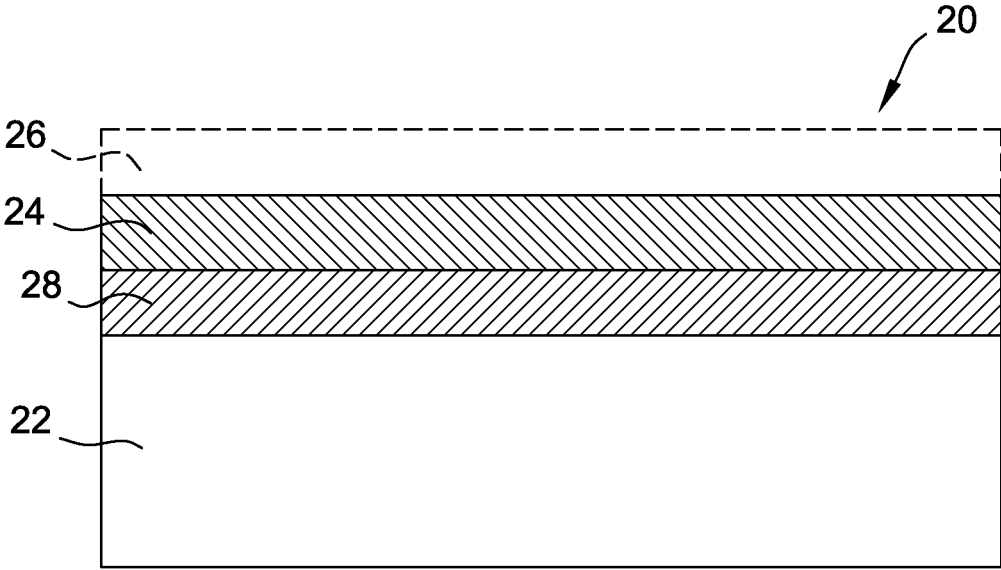
FIG. 2 is a depiction of a silicon-on-insulator wafer, the SOI wafer comprising a polycrystalline silicon charge trapping layer between a high resistivity substrate and a buried oxide layer.

In example embodiments, methods are provided which include depositing a semiconductor charge trapping layer (also referred to herein as a "semiconductor layer" or a "charge trapping layer") on a single crystal semiconductor handle substrate, e.g., a single crystal semiconductor handle wafer, such as a single crystal silicon handle wafer. The charge trapping layer may be deposited in a variety of processes, for example, by chemical vapor deposition. The single crystal semiconductor handle wafer including the charge trapping layer is useful in the production of a semiconductor-on-insulator (e.g., silicon-on-insulator) structure. Suitably, the charge trapping layer includes a polycrystalline semiconductor material such as silicon, SiGe, SiC, and Ge, and the polycrystalline semiconductor material is deposited onto an exposed front surface of a single crystal semiconductor handle substrate, e.g., a wafer, having a high resistivity. The charge trapping layer may also be referred to as a "polycrystalline semiconductor layer." In some embodiments, the charge trapping layer may additionally and/or alternatively include amorphous semiconductor material. In some embodiments, a dielectric layer (also referred to herein as a "buried oxide layer" or a "BOX layer") is bonded to and/or formed on the polycrystalline semiconductor layer (e.g., via bonding a single crystal semiconductor donor substrate having the dielectric layer to the polycrystalline layer) to form a multilayer structure including the handle substrate, the polycrystalline semiconductor layer, and the dielectric layer. The polycrystalline semiconductor layer acts as a high density trap region to prevent and/or kill the conductivity in the high resistivity handle substrate that may otherwise occur at an interface between the high resistivity handle substrate and the dielectric layer. The polycrystalline semiconductor layer also prevents the formation of induced charge inversion or accumulation layers in semiconductor-on-insulator structures prepared by the methods described herein that can contribute to power loss and non-linear behavior in electronic devices designed for radiofrequency (RF) device operation.

One problem associated with depositing semiconductor material to produce a charge trapping layer is that the deposited semiconductor layer may have internal, compressive stress created by the diffusion of deposited semiconductor (e.g., silicon) atoms to the semiconductor (e.g., polycrystalline semiconductor, such as polycrystalline silicon) grain boundaries. The compressive stress in the deposited semiconductor layer may cause bow and/or warp in the semiconductor-on-insulator (SOI) structure shape that make the structure unsuitable for subsequent use in device manufacture. For example, SOI structures with high degrees of bow and/or warp can be difficult to process on equipment with precision wafer handling automation as well as cause problems with focusing during lithography steps, among other issues. Therefore, semiconductor handle substrates having a deposited charge trapping layer must have suitable levels of bow and warp. This may be controlled during the semiconductor layer deposition process or may be corrected in subsequent processing (e.g., polishing). Moreover, other aspects of SOI structure production may negatively impact and/or contribute to bow and warp to the structure as well, such as formation of the dielectric (e.g., buried oxide) layer on the semiconductor charge trapping layer. For example, the compressive stresses resulting from semiconductor layer deposition and formation of the buried oxide layer (e.g., by thermal oxidation or chemical vapor oxide deposition) are additive and, when combined, may cause the bow and/or warp of the SOI structure to be out of specification.

In some processes, the stress in the deposited semiconductor charge trapping layer (or "semiconductor layer") may be controlled by post-deposition annealing steps that allow the interstitial atoms in the semiconductor layer to diffuse out of the grain boundaries. This creates tensile stress in the semiconductor layer that may suitably offset the compressive stress resulting from the buried oxide layer and facilitates minimizing the overall bow and warp of the wafer. Typically, the semiconductor layer is annealed at temperatures greater than the temperature used for the semiconductor layer deposition, such as temperatures greater than 1000° C. or greater than 1050° C. However, the extra thermal process may cause other defects in the handle substrate. For example, the elevated temperatures and time required for out diffusion of interstitial semiconductor atoms from the grain boundaries may cause crystallographic slip defects in the handle substrate. The slip defects will render the handle substrate unsuitable for subsequent device fabrication even once the bow and warp issues are corrected. High resistivity handle substrates (e.g., handle substrates having a resistivity of at least about 500 Ohm-cm) used for SOI structures and RF devices are particularly susceptible to crystallographic slip due to the lack of lattice and interstitial atoms (e.g., dopant atoms and/or interstitial oxygen atoms) that may otherwise strengthen the wafer.

Example methods described herein include depositing a semiconductor charge trapping layer (or "semiconductor layer") on a single crystal semiconductor handle substrate and annealing the semiconductor layer at or near (e.g., within 10° C., within 5° C., or within 1°C) the deposition temperature. Suitably, example methods described herein provide a semiconductor layer that has tensile stress, rather than compressive stress, due to the diffusion of interstitial atoms out of the grain boundaries of the deposited semiconductor material induced by annealing the semiconductor layer. The tensile stress in the semiconductor layer offsets compressive stress subsequently introduced, for example, by a dielectric layer bonded to and/or formed on the semiconductor layer, which thereby controls overall bow and warp of the multilayer structure. Advantageously, annealing the semiconductor layer to create tensile stress, performed in accordance with the methods described herein, also reduces or eliminates undesirable defects otherwise created in the single crystal semiconductor handle wafer by higher thermal processing. For example, in various embodiments, the single crystal semiconductor handle wafer is a high resistivity wafer (e.g., has a resistivity greater than about 500 Ohm-cm), and the example methods described herein include intermittently annealing the semiconductor layer to create out-diffusion of interstitial atoms from the grain boundaries at relatively low temperatures (e.g., less than 1000° C.) to reduce or eliminate crystallographic slip defects that may otherwise occur in high resistivity wafers at higher anneal temperatures.

In example methods described herein, the semiconductor charge trapping layer (or "semiconductor layer") is suitably produced by two or more cycles of depositing a portion of the semiconductor layer and interrupting the deposition process to anneal the deposited portion. Stated another way, the deposition of the semiconductor layer is performed by a cycling process in which a portion of the semiconductor layer is deposited, deposition is interrupted by pausing deposition gas flow, the portion of the semiconductor layer is annealed (suitably at or near the deposition temperature), and the next portion of the semiconductor layer is deposited on the previously annealed portion. Each portion of the semiconductor charge trapping layer may also be referred to herein as "a layer of semiconductor material". Thus, in an example method, the semiconductor layer is produced by depositing a first layer of semiconductor material, annealing the first layer of semiconductor material, depositing a second layer of semiconductor material on the annealed first layer, annealing the second layer of semiconductor material, and so on. By depositing the semiconductor layer in this way, the semiconductor layer may include, for example, two or more annealed layers, such as three or more annealed layers of semiconductor material, or between three and about 50 annealed layers, or between three and about 40 annealed layers, or between three and about 30 annealed layers, or between three and about 25 annealed layers, or between three and about 20 annealed layers, or between three and about 10 annealed layers of semiconductor material. A large number of layers of semiconductor material may be deposited and annealed to produce the semiconductor charge trapping layer, limited in part by throughput demands and by the smallest practical layer thickness that may be deposited, which may be about 20 nanometers. In some embodiments, the thickness of each annealed layer of semiconductor material (i.e., each portion of the semiconductor charge trapping layer) may be between 0.05 micrometers (μm) and 5 μm, such as between 0.1 μm and 1 μm, and the semiconductor charge trapping layer may have a thickness between 0.1 μm and 50 μm, such as between 1 μm and 10 μm. The thickness of each portion of the semiconductor charge trapping layer may depend on a desired thickness of the charge trapping layer and the number of cycles performed to produce the charge trapping layer. Each deposited portion of the semiconductor charge trapping layer is suitably annealed at or near the deposition temperature, and the anneal is performed to out-diffuse interstitial atoms from the grain boundaries of the deposited layer of semiconductor material. It has been observed that intermittent annealing of portions of the semiconductor layer at or near the deposition temperature contributes to significantly improved site flatness, which may be measured as Site Frontside Referenced Least Squares Focal Plane Range (SFQR). Moreover, the intermittent annealing during deposition may reduce or eliminate the need for post-deposition anneal of the semiconductor layer at higher temperatures. This reduces processing time otherwise associated with ramping up the temperature for the post-deposition anneal, thereby increasing overall efficiency and throughput.

The methods described herein may also facilitate control over bow and warp of the semiconductor-on-insulator structure, e.g., silicon-on-insulator, that includes a dielectric layer of a single crystal semiconductor donor substrate bonded to the semiconductor charge trapping layer of the handle substrate. The dielectric layer may be formed as a semiconductor oxide film (e.g., a silicon oxide film) on a front surface of the donor substrate (e.g., a single crystal silicon donor substrate). Due to the difference in the coefficients of thermal expansion between silicon oxide and silicon, for example, high intrinsic, compressive stresses develop in the oxide films on silicon wafers. In embodiments wherein the dielectric oxide film is contributed by oxide on the surface of the donor structure, the final semiconductor-on-insulator structure has oxide from one wafer only and, therefore, it is deformed by the compressive oxide stresses. The tensile stress created in the semiconductor layer offsets the compressive stress in the dielectric layer, thereby reducing overall bow and warp of the semiconductor-on-insulator structure. It has also been observed that polishing (e.g., by chemical mechanical polishing) the semiconductor layer produced by intermittent annealing in accordance with the present disclosure results in greater tensile stresses that contribute to a negative bow of the handle substrate and further balance the compressive stress induced by the dielectric layer, thereby reducing bow and warp of the final semiconductor-on-insulator structure.

Figure 3:
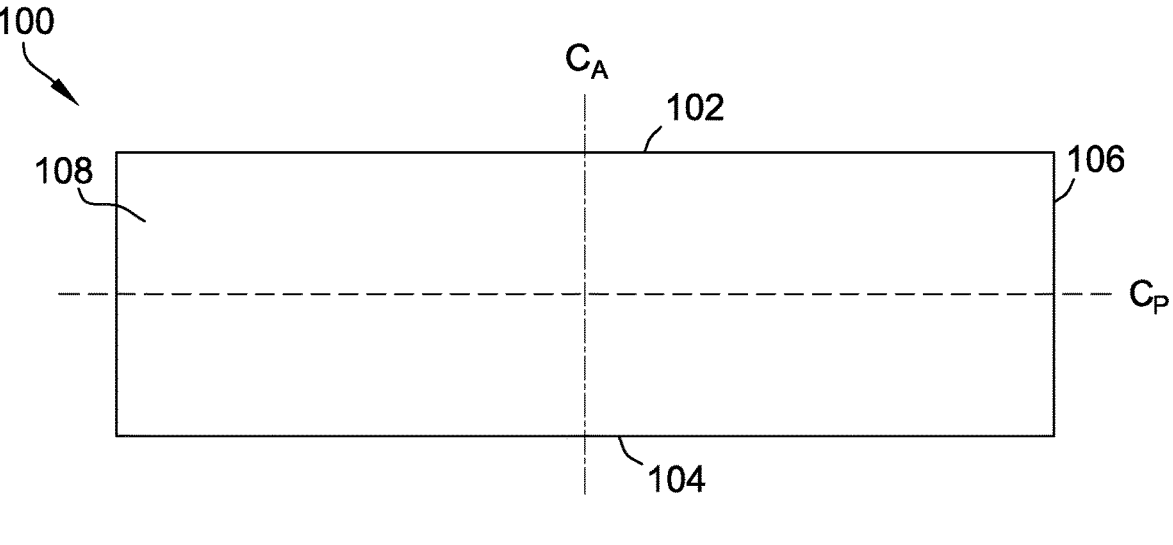
FIG. 3 is a depiction of an example single crystal semiconductor handle substrate for use in preparing a multilayer structure according to a method of the present disclosure.
Figure 5:
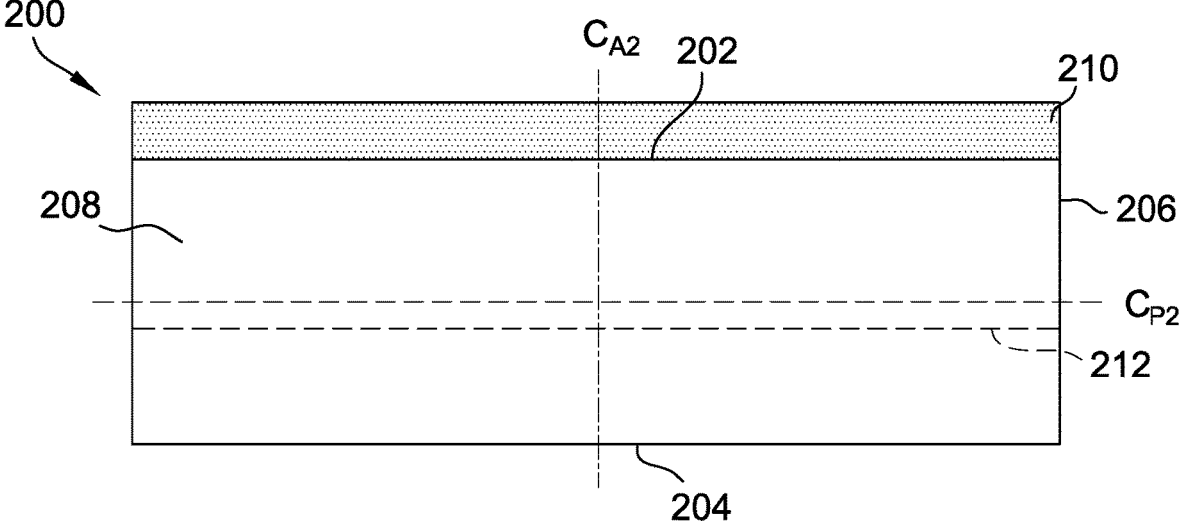
FIG. 5 is a depiction of an example single crystal semiconductor donor substrate for use in preparing a multilayer structure according to a method of the present disclosure, the donor substrate having a dielectric layer formed on a front surface thereof.

Referring now to the drawings, a single crystal semiconductor substrate 100 for use in the example methods described herein is shown in FIG. 3. The substrate 100 may be used as a semiconductor handle substrate, e.g., a single crystal semiconductor handle wafer. The substrate 100 may also be used as a semiconductor donor substrate, e.g., a single crystal semiconductor donor wafer (such as the donor substrate 200 shown in FIG. 5). As the description proceeds, the terms "substrate" and "wafer" may be used interchangeably. In general, the substrate 100 includes two major, generally parallel surfaces. One of the parallel surfaces is a front surface 102 of the substrate, and the other parallel surface is a back surface 104 of the substrate. The substrate 100 also includes a circumferential edge 106 joining the front surface 102 and the back surface 104, a bulk region 108 between the front surface 102 and the back surface 104, and a central plane $C_P$ between the front surface 102 and the back surface 104. The substrate 100 additionally includes an imaginary central axis $C_A$ substantially perpendicular to the central plane $C_P$. A radial length of the substrate 100 is measured as the distance between the central axis $C_A$ and the circumferential edge 106. A diameter of the substrate 100 is measured across the circumferential edge 106. In addition, because the semiconductor substrate 100, e.g., a silicon wafer, typically has some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within the imaginary central plane $C_P$ which is approximately equidistant between the front surface 102 and the back surface 104.

Prior to any operation as described herein, the front surface 102 and the back surface 104 of the substrate 100 may be substantially identical. A surface 102 or 104 is referred to as a "front surface" or a "back surface," respectively, merely for convenience and generally to distinguish the surface upon which the operations of the example methods are performed. In the context of the present disclosure, the front surface 102 of the single crystal semiconductor handle substrate 100, e.g., a single crystal silicon handle wafer, refers to the major surface of the substrate 100 that becomes an interior surface of a bonded structure or a semiconductor-on-insulator structure (such as those shown in FIGS. 6 and 7). It is upon this front surface 102 that the charge trapping layer 110 is formed (shown in FIG. 4). Accordingly, the back surface 104 of the single crystal semiconductor handle substrate 100 refers to the major surface that becomes an exterior surface of a bonded structure or a semiconductor-on-insulator structure.

In some embodiments, the front surface 102 of the single crystal semiconductor substrate 100 may include a dielectric layer, e.g., a silicon dioxide layer, which forms the buried oxide (BOX) layer in the final structure. For example, where the substrate 100 is a single crystal semiconductor donor substrate 200 (shown in FIG. 5), a dielectric layer 210 may be formed on the front surface 202 of the donor substrate 200 which forms the BOX layer in the final structure. A back surface 204 of the single crystal semiconductor donor substrate 200, e.g., a single crystal silicon donor wafer, refers to the major surface that becomes an exterior surface of a bonded structure or a semiconductor-on-insulator structure (such as those shown in FIGS. 6 and 7). As described above for the substrate 100, the substrate 200 shown in FIG. 5 also includes a circumferential edge 206 joining the front surface 202 and the back surface 204, a bulk region 208 between the front surface 202 and the back surface 204, a central plane $C_{P2}$ between the front surface 202 and the back surface 204, an imaginary central axis $C_{A2}$ substantially perpendicular to the central plane $C_{P2}$. A radial length of the substrate 200 is measured as the distance between the central axis $C_{A2}$ and the circumferential edge 206, and a diameter of the substrate 200 is measured across the circumferential edge 206. Upon completion of bonding and wafer thinning operations, described in further detail below, the single crystal semiconductor donor substrate 200 forms the semiconductor device layer 402 of the semiconductor-on-insulator (e.g., silicon-on-insulator) composite structure 400 (shown in FIG. 7).

The single crystal semiconductor handle substrate 100 and the single crystal semiconductor donor substrate 200 may be single crystal semiconductor wafers. In various embodiments, the semiconductor wafers include a semiconductor material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer 100 and single crystal silicon donor wafer 200, typically have a nominal diameter of at least about 150 mm, at least about 200 mm, at least about 300 mm, or at least about 450 mm. Wafer thicknesses may vary from about 250 μm to about 1500 μm, such as between about 300 μm and about 1000 μm, suitably within the range of about 500 μm to about 1000 μm. In some specific embodiments, the wafer thickness may be about 775 μm. The wafer thickness is measured as the distance between opposing major surfaces, e.g., between the front surface 102, 202 and the back surface 104, 204.

In certain embodiments, the single crystal semiconductor handle substrate 100 and the single crystal semiconductor donor substrate 200 include single crystal silicon wafers which have been sliced from a single crystal ingot grown in accordance with Czochralski crystal growing methods or float zone growing methods. Such methods, as well as silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982, the entire disclosure of which is incorporated by reference herein. Suitably, the wafers are polished and cleaned by methods known to those skilled in the art. See, for example, W.C. O'Mara et al., *Handbook of Semiconductor Silicon Technology*, Noyes Publications. The wafers may also be cleaned, for example, in a SC1/SC2 solution. Suitably, both the single crystal silicon handle wafer 100 and the single crystal silicon donor wafer 200 have mirror-polished front surface finishes that are free from surface defects, such as scratches and large particles.

In some embodiments, the single crystal semiconductor handle substrate 100 and the single crystal semiconductor donor substrate 200 have interstitial oxygen in concentrations that are generally achieved by the Czochralski-growth method. In some embodiments, the substrates 100 and 200 have interstitial oxygen in a concentration between about 4 PPMA and about 18 PPMA. In some embodiments, the substrates 100 and 200 have interstitial oxygen in a concentration between about 10 PPMA and about 35 PPMA. Suitably, the substrates 100 and 200 have interstitial oxygen in a concentration of no greater than about 10 ppma. Interstitial oxygen may be measured according to SEMI MF 1188-1105.

In some embodiments, the single crystal semiconductor handle substrate 100, such as a single crystal silicon handle wafer, has a relatively high minimum bulk resistivity. The single crystal semiconductor donor substrate 200 may also have a relatively high minimum bulk resistivity. High resistivity single crystal semiconductor substrates are generally sliced from single crystal ingots grown by the Czochralski method or float zone method. Single crystal semiconductor conductor substrates slice from Czochralski-grown ingot may be subjected to a thermal anneal at a temperature ranging from about 600° C. to about 1000° C. in order to annihilate thermal donors caused by oxygen that are incorporated during crystal growth. In some embodiments, the single crystal semiconductor wafer has a minimum bulk resistivity of at least about 500 Ohm-cm, at least about 1000 Ohm-cm, or even at least about 3000 Ohm-cm, such as between about 500 Ohm-cm and about 100,000 Ohm-cm, between about 1000 Ohm-cm and about 100,000 Ohm-cm, between about 500 Ohm-cm and about 10,000 Ohm-cm, between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5000 Ohm-cm.

Methods for preparing high resistivity wafers are known in the art, and such high resistivity wafers may be obtained from commercial suppliers, such as GlobalWafers Co., Ltd., Taiwan.

In some embodiments, the back surface 104, 204 of single crystal semiconductor substrates 100, 200 may be intentionally damaged by a sand blasting process or by a caustic etch. In other embodiments, the back surface 104, 204 of the substrates 100, 200 is a polished surface that is free from surface defects, such as scratches and large particles.

The front surface 102, and optionally the back surface 104, of the single crystal semiconductor handle substrate 100 may be treated, e.g., by an oxidation process, to form an interfacial layer prior to formation of the charge trapping layer 110. The interfacial layer may include a material selected from silicon dioxide, silicon nitride, and silicon oxynitride. In certain embodiments, the interfacial layer may comprise silicon dioxide. To form a silicon dioxide interfacial layer, the front surface 102 of the substrate 100 is oxidized prior to formation of the charge trapping layer 110 such that the front surface 102 of the substrate 100 includes an oxide film. Oxidizing the front surface 102 may be accomplished by thermal oxidation (in which some portion of the deposited semiconductor material film will be consumed), CVD oxide deposition, and/or atomic layer deposition. In some embodiments, the single crystal semiconductor handle substrate 100, e.g., a single crystal silicon handle wafer, may be thermally oxidized in a furnace such as an ASM A400 or an ASM A412. The temperature may range from 750° C. to 1200° C. in an oxidizing ambient. The oxidizing ambient atmosphere may be a mixture of inert gas, such as Ar or $N_2$, and $O_2$. The oxygen content may vary from 1 to 10 percent, or higher. In some embodiments, the oxidizing ambient atmosphere may be up to 100% oxygen (a "dry oxidation"). In some embodiments, the oxidizing ambient atmosphere may include oxygen and ammonia, which is suitable for depositing silicon oxynitride. In some embodiments, the ambient atmosphere may comprise a mixture of inert gas, such as Ar or $N_2$, and oxidizing gases, such as $O_2$ and water vapor (a "wet oxidation"). In some embodiments, the ambient atmosphere may comprise a mixture of inert gas, such as Ar or $N_2$, and oxidizing gas, such as $O_2$ and water vapor (a "wet oxidation"), and a nitriding gas, such as ammonia. In some embodiments, the ambient atmosphere may comprise a mixture of inert gas, such as Ar or $N_2$, and a nitriding gas, such as ammonia, which is suitable for depositing silicon nitride. In an exemplary embodiment, single crystal semiconductor handle substrates 100 may be loaded into a vertical furnace, such as an ASM A400 or an ASM A412. The temperature is ramped to the oxidizing temperature with a mixture of $N_2$ and $O_2$. At a desired temperature water vapor may be introduced into the gas flow. After a desired oxide film thickness has been obtained, the water vapor and $O_2$ are turned off and the furnace temperature is reduced and substrates 100 are unloaded from the furnace. The oxidation layer on the front surface 102, the back surface 104, or both may be between about 100 Angstroms and about 100,000 Angstroms.

In some embodiments, the oxide layer may be relatively thin, such as between about 5 Angstroms and about 25 Angstroms, such as between about 10 Angstroms and about 15 Angstroms. Thin oxide layers can be obtained on both sides of a semiconductor wafer by exposure to an aqueous solution including an oxidizing agent, such as an SC1 and/or an SC2 cleaning solution. In some embodiments, the SC1 solution comprises 5 parts deioinized water, 1 part aqueous $H_4OH$ (ammonium hydroxide, 29% by weight of $NH_3$), and 1 part of aqueous $H_2O_2$ (hydrogen peroxide, 30%). In some embodiments, the substrate 100 may be oxidized by exposure to an aqueous solution comprising an oxidizing agent, such as an SC2 solution. In some embodiments, the SC2 solution comprises 5 parts deioinized water, 1 part aqueous HCl (hydrochloric acid, 39% by weight), and 1 part of aqueous $H_2O_2$ (hydrogen peroxide, 30%).

In some embodiments, the exposed front surface 102 of the single crystal semiconductor handle substrate 100 is not oxidized prior to formation of the charge trapping layer 110.

Prior to formation of the charge trapping layer 110, and optionally after oxidation of the front surface 102 of the single crystal semiconductor handle substrate 100, the single crystal semiconductor handle substrate 100 may subjected to a pre-treatment operation that includes exposing surfaces 102, 104 to an ambient atmosphere comprising reducing agents and/or etching agents. Exposure to the ambient atmosphere comprising reducing agents and/or etching agents may advantageously clean front surface 102, and optionally the back surface 104, of the substrate 100, which may include an interfacial oxide front surface layer, and texturizes the front surface 102 for subsequent semiconductor material deposition. Handling of the substrate 100 may undesirably cause contaminants, such as organic contaminants and boron, aluminum, phosphorus, and the like, to deposit on the front and back surfaces 102, 104 of the handle substrate 100. The contaminants may either disrupt the nucleation process of the subsequently deposited charge trapping layer 110 or become undesired dopants in the handle substrate 100 that alter the resistivity of the substrate 100 and/or charge trapping layer 110. This may result in enhanced radiofrequency signal distortion and power loss. Exposing the surfaces 102, 104 of the substrate 100 to the ambient atmosphere that includes reducing agents and/or etching agents may clean or otherwise remove these contaminants. For example, a reducing agent, such as hydrogen, may react with common contaminants such as boron oxide and aluminum oxide, and an etching gas, such as chlorine or hydrogen chloride, reacts with aluminum, boron, and phosphorus to form volatile chloride products that are carried away from the surfaces 102 of the substrate 100 by hydrogen gas.

In the presence of a semiconductor oxide, such as silicon oxide, on the surfaces 102, 104 of the single crystal semiconductor handle substrate 100, carbon atoms in the organic contaminants may replace semiconductor atoms and form carbon monoxide which is purged off the surfaces 102, 104 by hydrogen carrier gas. Performing the cleaning and etching operation prior to deposition of the semiconductor material may be advantageous for obtaining a pure and high-efficiency charge trapping layer 110. Additionally, the cleaning and etching process may open holes in the interfacial oxide front surface layer to form a textured oxide structure and thus exposes the front surface 102 to precursors during deposition of the charge trapping layer 110. The density and size of the holes in the textured oxide front surface layer may be controlled by the temperature, time, and gas flows during the cleaning and etching operation. For example, the size of the holes may be controlled in the range of between about 5 nanometers and about 1000 nanometers, such as between about 5 nanometers and about 500 nanometers, or between about 5 nanometers and about 200 nanometers, which enables the control of the semiconductor material grain size as well as the film stress of the charge trapping layer 110. The open holes in the interfacial oxide front surface layer provide nucleation sites for the charge trapping layer 110. The textured oxide front surface layer may be controlled so that a uniform density of open holes is achieved across the front surface 102 without removing the entire oxide front surface layer. The residual oxide may improve the thermal stability of the charge trapping layer 110. For example, in subsequent thermal processes in semiconductor-on-insulator structure and RF device fabrication, the charge trapping layer 110, which suitably includes a polycrystalline or amorphous structure, may transition to a monocrystalline structure through recrystallization that is facilitated by direct contact of polycrystalline or amorphous semiconductor grains and the monocrystalline (i.e., single crystal) semiconductor handle substrate 100. The residual oxide at the interface between the semiconductor charge trapping layer 110 and the front surface 102 of the substrate 100 may effectively prevent the recrystallization process and thus prevent the charge trapping layer 110 from transitioning to a monocrystalline structure that has no charge trapping function.

The cleaning and etching operation may advantageously be performed in the same chamber, e.g., a CVD reaction chamber, in which deposition of the charge trapping layer 110 is performed. As described above, the reducing atmosphere may include an etchant to further enhance the cleaning operation. For example, the ambient atmosphere for cleaning may include hydrogen, hydrogen chloride, chlorine, or any combination of hydrogen, hydrogen chloride, and chlorine. Additionally, the cleaning may be performed at an elevated temperature, such as greater than about 850° C., such as between about 850° C. and about 1100° C., or between about 850° C. and about 1000° C. The pressure inside the chamber may be atmospheric pressure or at a reduce pressure, such as between about 1 Torr and about 760 Torr, such as between about 1 Torr and about 400 Torr. At the desired temperature for cleaning, the substrate may be exposed to the ambient atmosphere comprising hydrogen, hydrogen chloride, chlorine, or any combination of hydrogen, hydrogen chloride, and chlorine for a duration between about 1 second and about 300 seconds, such as between about 5 seconds and about 60 seconds, or between about 10 seconds and about 40 seconds.

After suitable operations have been performed to prepare and treat the front surface 102 of the single crystal semiconductor handle substrate 100, semiconductor material is deposited onto the exposed front surface 102 of the substrate 100. Deposition of the semiconductor material produces the charge trapping layer 110 on the front surface 102 of the substrate 100 (shown in FIG. 4). The charge trapping layer 110 may also be referred to herein as a semiconductor charge trapping layer 110 or a semiconductor layer 110.

Semiconductor material suitable for use in forming the charge trapping layer 110 is suitably capable of forming a highly defective layer between the single crystal semiconductor substrate 100 and a dielectric layer subsequently bonded and/or formed on the charge trapping layer 110 (e.g., the dielectric layer 210 described below). Such semiconductor materials include polycrystalline semiconductor materials and amorphous semiconductor materials. Semiconductor materials that may be polycrystalline or amorphous include, for example, silicon (Si), silicon germanium (SiGe), silicon doped with carbon or silicon carbide (SiC), and germanium (Ge). Silicon germanium includes an alloy of silicon germanium in any molar ratio of silicon and germanium. For example, where the semiconductor material includes silicon germanium, the molar percent of germanium may be at least about 1 molar %, at least about 5 molar %, at least about 20 molar %, at least about 50 molar %, at least about 90 molar %, or at least about 99.9 molar %.

Silicon doped with carbon includes a compound of silicon and carbon, which may vary in molar ratio of silicon and carbon. As used herein, the term "polycrystalline" denotes a semiconductor material comprising small semiconductor crystals having random crystal orientations. For example, polycrystalline silicon grains may be as small in size as about 20 nanometers. The smaller the crystal grain size of polycrystalline semiconductor material deposited the higher the defectivity in the charge trapping layer 110. The term "amorphous" denotes a semiconductor material that is in non-crystalline allotropic form, which lacks short range and long range order. Silicon grains having crystallinity over no more than about 10 nanometers may also be considered essentially amorphous silicon.

The charge trapping layer 110 suitably has a resistivity at least about 1000 Ohm-cm, or at least about 3000 Ohm-cm, such as between about 1000 Ohm-cm and about 100,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5000 Ohm-cm.

The semiconductor material for deposition onto the front surface 102 of the single crystal semiconductor handle substrate 100 may be deposited by means known in the art to produce the charge trapping layer 110. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, polycrystalline silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr. In some embodiments, deposition may occur at or below atmospheric pressure, such as a pressure between about 1 Torr and about 760 Torr, between about 10 Torr and about 760 Torr, or between about 1 Torr and about 400 Torr. Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the silicon layer may comprise a carbon concentration of at least about 1% on an atomic basis, such as between about 1% on an atomic basis and about 10% on an atomic basis. The precursor gases for depositing the semiconductor material may be mixed with a carrier gas such as hydrogen (e.g., trichlorosilane in hydrogen to deposit polycrystalline silicon). The concentration of the precursor gas may be determined based on desired deposition effects (e.g., deposition rate).

In certain embodiments, the charge trapping layer 110 is formed by deposition of polycrystalline semiconductor material. The charge trapping layer 110 may also be referred to herein as the polycrystalline semiconductor charge trapping layer 110 or the polycrystalline semiconductor layer 110.

In some embodiments, deposition of the semiconductor material to produce the charge trapping layer 110 is performed in an atmospheric reactor that may typically be used, for example, for epitaxial deposition on an exposed exterior layer of a semiconductor-on-insulator structure. For example, deposition of the semiconductor material may be performed in an ASM E3000 epi-reactor that includes a gas panel to supply necessary process gases (e.g., H₂, HCl, dichlorosilane, and/or trichlorosilane) at a desired flow rates to a quartz reaction chamber. The quartz reaction chamber may be rectangular in cross section and includes a silicon-carbide coated graphite susceptor that supports the substrate 100 during processing. The susceptor may rotate the substrate 100 and has a recess or pocket that is suitably sized for supporting the substrate 100 (e.g., a 300 mm wafer). The substrate 100 is seated in the recess of the susceptor during processing and is supported on the backside by a ledge in the recess that contacts the substrate 100 in close proximity to (e.g., within a few millimeters from) the circumferential edge 106 of the substrate 100 and at a height that holds the front surface 102 of the substrate 100 slightly above a top surface of the susceptor. The area of the susceptor beneath the substrate 100 and within the supporting ledge of the susceptor may be perforated with holes to allow ventilation of the back surface 104 of the substrate 100 which faces the susceptor. The substrate 100 may be delivered to the reaction chamber by a robot that handles the substrate 100 without substantially introducing contamination or causing damage to the surfaces 102, 104 of the substrate. The reaction chamber is located adjacent to heating elements (e.g., flat lamp banks), which may be nominally parallel with and above and below the substrate 100 and susceptor, which heat the substrate 100 and susceptor to the desired process temperature. The desired gas flow rates, susceptor rotation speed, and temperature typically change at various times throughout the process. Changes in process parameters such as the gas flow rates, rotation speed, temperature, and wafer loading and unloading are controlled by computer automation, based on a predetermined "recipe" that has been developed to produce a substrate 100 with the desired characteristics when processing is complete. Desired characteristics that control process parameters include crystallographic slip in the high resistivity substrate 100, resistivity, deposited film thickness (e.g., thickness of the semiconductor layer 110), film quality parameters such as resistivity of the semiconductor layer 110, semiconductor material grain size, surface roughness, wafer flatness post-deposition (e.g., site flatness, often characterized with the SFQR parameter), and other characteristics. An exemplary epitaxial reactor suitable for deposition of the semiconductor layer 110 is an epsilon E3000 single-wafer epitaxial reaction manufactured by ASM International. Other reactor chambers include those marketed under the trade name Centura by Applied Materials. Advantageously, performing the semiconductor layer deposition in these reactors may enable several different processes used in semiconductor-on-insulator and RF device fabrication to be run on the same processing tool (e.g., semiconductor charge trapping layer deposition, post-cleave top semiconductor device layer smoothing by gas phase etching with HCl, top semiconductor device layer thickening by epitaxial deposition, and standard blanket epitaxial layer deposition).

The reaction chamber within which deposition of the semiconductor layer 110 is performed may be at any suitable pressure (e.g., atmospheric) during deposition. For example, deposition may occur at or below atmospheric pressure, such as a pressure between about 1 Torr and about 760 Torr, between about 10 Torr and about 760 Torr, or between about 1 Torr and about 400 Torr. The deposition time may vary depending on the deposition temperature, concentration and desired thickness of the semiconductor layer 110. In some embodiments, the semiconductor layer 110 is at least about 0.1 μm thick or at least about 0.5 μm, at least about 1 μm, at least about 2.5 μm, or at least about 4 μm thick (e.g., from about 0.1 μm to about 50 μm, from about 0.25 μm to about 20 μm, or from about 1 μm to about 10 μm).

The semiconductor material used to form the semiconductor charge trapping layer 110 may be deposited at any suitable temperature based on the semiconductor material to be deposited, deposition method, and other considerations, and the deposition temperature may be selected to enhance or promote certain properties of the semiconductor layer 110. For example, the deposition temperature of the semiconductor material may be suitable to increase the surface area of the semiconductor layer 110. In some embodiments, the semiconductor layer 110 is deposited at a suitable temperature to decrease the grain size of the deposited semiconductor material. As described above, the semiconductor layer 110 may be deposited using chemical or physical vapor deposition, for example, metalorganic chemical vapor deposition (MOCVD), physical vapor deposition (PVD), chemical vapor deposition (CVD), low pressure chemical vapor deposition (LPCVD), or plasma enhanced chemical vapor deposition (PECVD). In some embodiments, the semiconductor layer 110 includes polycrystalline silicon deposited by CVD, and suitable silicon precursors for CVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, the silicon precursor for depositing the polycrystalline silicon by CVD may be selected from silane, dichlorosilane ($SiH_2Cl_2$), and trichlorosilane ($SiHCl_3$). In embodiments in which a silicon precursor is used to deposit polycrystalline silicon, the polycrystalline silicon may be deposited at a temperature between about 800° C. and about 1150° C. In some embodiments, the deposition temperature for the polycrystalline semiconductor layer 110 is a temperature less than about 1125° C., less than about 1100° C., less than about 1075° C., less than about 1050° C., less than about 1000° C. or less than about 900° C., or from about 800° C. to about 1150° C., from about 800° C. to about 1100° C. or from about 850° C. to about 1000° C. The temperature may also contribute to high growth rate, thereby contributing to throughput and cost reduction. CVD deposition rates may be at least about 0.1 micrometer/minute, such as between about 0.1 micrometer/minute to about 10 micrometers/minute, or between about 0.1 micrometer/minute to about 2 micrometers/minute. It will be appreciated that deposition temperatures for certain precursor gases, which depend on whether the semiconductor material includes, for example, polycrystalline or amorphous silicon, SiGe, SiC, or Ge, may be selected based on known suitable temperatures (e.g., according to published methods).

In the example methods to produce the semiconductor layer 110, the deposition of the semiconductor material is temporarily interrupted, at least once and preferably more than once. Between deposition stages to produce the semiconductor layer 110, supply of precursor gases to the reaction chamber is temporarily paused and the previously deposited semiconductor material is annealed at or near the deposition conditions (e.g., at or near the deposition temperature and pressure). After the temporary anneal, the supply of precursor gases to the reaction chamber is resumed for the next deposition stage. Thus, the semiconductor layer 110 is suitably produced by two or more cycles of depositing a portion of the semiconductor layer 110 and interrupting the deposition process to anneal the deposited portion. Stated another way, the deposition of the semiconductor layer 110 is performed by a cycling process in which a portion of the semiconductor layer 110 is deposited, deposition is interrupted by temporarily ceasing precursor gas flow, the portion of the semiconductor layer 110 is annealed, and the next portion of the semiconductor material 110 is deposited on the previously annealed portion. Each portion of the semiconductor charge trapping layer 110 may also be referred to herein as "a layer of semiconductor material". Thus, in an example method, the semiconductor layer 110 is produced by depositing a first layer of semiconductor material, annealing the first layer of semiconductor material, depositing a second layer of semiconductor material on the annealed first layer, annealing the second layer of semiconductor material, and so on. By depositing the semiconductor layer 110 in this way, the semiconductor layer 110 may include, for example, two or more annealed layers of semiconductor material, such as three or more annealed layers, or between three and about 50 annealed layers, or between three and about 40 annealed layers, or between three and about 30 annealed layers, or between three and about 25 annealed layers, or between three and about 20 annealed layers, or between three and about 10 annealed layers of semiconductor material. The number of annealed layers of semiconductor material that produce the semiconductor layer 110 equates to the number of cycles of depositing a portion of the semiconductor layer 110 and interrupting the deposition process to anneal the deposited portion that are performed. Thus, two cycles would produce two annealed layers of semiconductor material, three cycles would produce three annealed layers, ten cycles would produce ten annealed layers, and so on. A large number of layers of semiconductor material may be deposited and annealed to produce the semiconductor charge trapping layer 110, limited in part by throughput demands and by the smallest practical layer thickness that may be deposited, which may be about 20 nanometers.

The duration of each cycle of depositing a portion of the semiconductor layer 110 and interrupting the deposition process to anneal the deposited portion may depend on the desired thickness of each annealed layer of semiconductor material. In some embodiments, the thickness of each deposited layer of semiconductor material may be at least about 0.1 μm, at least about 0.2 μm, at least about 0.5 μm, such as between about 0.05 μm and about 5 μm, between about 0.1 μm and about 5 μm, or between about 0.1 μm and about 1 μm. The deposited layers of semiconductor material may have the same thickness or the thickness may vary between layers. The duration of depositing each layer of semiconductor material for each cycle may be between about 1 second (s) and about 60 s, such as between about 1 s and about 15 s, between about 1 s and about 10 s, between about 10 s and about 30 s, between about 15 s and about 30 s, between about 15 s and about 20 s, between about 20 s and about 30 s, or between about 30 s and about 45 s. The duration of annealing each deposited layer of semiconductor material for each cycle may be between 1 s and about 60 s, such as between about 1 s and about 15 s, between about 1 s and about 10 s, between about 10 s and about 30 s, between about 15 s and about 30 s, between about 15 s and about 20 s, between about 20 s and about 30 s, or between about 30 s and about 45 s. The thickness of each layer of semiconductor material is selected based on the desired number of cycles used to produce the semiconductor layer 110 and the desired thickness of the semiconductor layer 110. In some embodiments, the semiconductor layer 110 is at least about 0.1 μm thick or at least about 0.5 μm, at least about 1 μm, at least about 2.5 μm, or at least about 4 μm thick (e.g., from about 0.1 μm to about 50 μm, from about 0.25 μm to about 20 μm, or from about 1 μm to about 10 μm). The total duration of annealing the layers of semiconductor material may be known or empirically determined as a suitable anneal time at a given temperature to out-diffuse interstitial atoms from the grain boundaries of the semiconductor layer 110 having a given thickness and distributed across the cycles according to the thickness of the layer of material deposited at each cycle. For example, an anneal time may be equally distributed across each cycle where the cycles produce layers of semiconductor material of approximately equal thicknesses. Thus, where a total anneal time of about 140 s is determined to be suitable for a semiconductor layer 110 produced by 7 cycles of depositing and annealing layers of semiconductor material having approximately equal thicknesses, each cycle would include about a 20 s anneal.

Each layer of semiconductor material deposited and annealed to produce the semiconductor layer 110 is deposited at a deposition temperature and annealed at an anneal temperature. As described above, deposition is interrupted by ceasing the flow of precursor gases to the reaction chamber. After interruption of the deposition, the previously deposited layer of semiconductor material is annealed within the ambient atmosphere of the reaction chamber, which may contain hydrogen, hydrogen chloride, and/or chlorine gases. The annealing operations performed throughout the cycling process produce a semiconductor layer 110 that suitably has tensile stress rather than compressive stress. Compressive stress in the semiconductor layer 110 may otherwise be created during deposition of the semiconductor material. Each annealing operation may be performed at reduced pressure or atmospheric pressure, such as between about 1 Torr and about 760 Torr, or between about 10 Torr and about 760 Torr. Suitably, when the deposition of the semiconductor material is interrupted, no increase in temperature is purposely created within the reaction chamber such that the anneal temperature is substantially the same as or in close proximity to the deposition temperature. The anneal temperature may suitably be within about 10° C., within about 5° C., or within about 1° C. of the deposition temperature. It will be appreciated that some incidental temperature changes may occur when the precursor gas supply is ceased, due to, for example, a difference in temperature between the precursor gases and the ambient atmosphere during the anneal. In other embodiments, a slight increase or decrease in temperature may purposely occur between the deposition temperature and the anneal temperature, for example, by changing the heat supplied to heating elements located adjacent to the reaction chamber. At least one of the deposition temperature and the anneal temperature, or both of the deposition temperature and the anneal temperature, may be the same across each cycle performed to produce the semiconductor layer 110, or the deposition temperature and/or the anneal temperature may vary for each cycle. Suitably, the deposition temperature and the anneal temperature for each cycle is each a relatively low temperature that is less than about 1100° C., less than about 1050° C., or less than about 1000° C. The deposition temperature and the anneal temperature may each also be greater than about 800° C., greater than about 850° C., or greater than about 900° C. For example, the deposition temperature and the anneal temperature for each cycle may be between about 800° C. and about 1100° C., such as between about 850° C. and about 1000° C., between about 900° C. and about 1000° C., between about 925° C. and about 975° C., between about 925° C. and about 950° C., or between about 950° C. and about 1000° C.

Each annealing operation of each cycle is performed to produce tensile film stress in a layer of semiconductor material, i.e., a portion of the semiconductor layer 110, deposited during a respective cycle. That is, each annealing operation causes the compressive stress induced during deposition of the layer of semiconductor material to transition to tensile stress by the out-diffusion of interstitial atoms from the grain boundaries of the semiconductor material. Distributing the annealing operation across multiple cycles during the deposition process may facilitate improving the ability to out-diffuse interstitial atoms from the grain boundaries of the semiconductor layer 110 compared to an anneal operation performed for the same total duration and at the same temperature but after the entire layer 110 has been deposited. This is because the anneal is performed for relatively thinner layers of deposited, pre-annealed semiconductor material, and the distance to out-diffuse interstitial atoms from the grain boundaries of the deposited semiconductor material is reduced. As such, the time required for the out-diffusion of the interstitial atoms via annealing at a given temperature is reduced. Each annealing operation may produce other desired properties in addition to tensile stress of the semiconductor layer 110, such as high purity of semiconductor material, high resistivity, desired nuclei size and uniformity, and a clean exposed surface of the semiconductor layer 110. Moreover, performing the annealing operations at relatively low temperatures reduces or eliminates defects in the high resistivity substrate 100, such as crystallographic slip defects, that are otherwise induced at higher temperature anneals.

A semiconductor seed layer may be deposited onto the front surface 102 of the substrate 100 and annealed prior to the cycling process to deposit a semiconductor layer 110. The semiconductor seed layer is used to promote growth of the subsequent layers of semiconductor material in producing the semiconductor layer 110 and improve charge trapping efficiency of the semiconductor layer 110. The semiconductor layer 110 may thus include the semiconductor seed layer and the layers of semiconductor material deposited and annealed during the cycling process described above. The semiconductor seed layer may include one or more semiconductor materials such as silicon, SiGe, SiC, and Ge. The semiconductor material used to produce the semiconductor seed layer may be the same material as the subsequently deposited layers of semiconductor material or may be a different semiconductor material. For example, where a polycrystalline semiconductor layer 110 is deposited, the semiconductor seed layer may be a polycrystalline semiconductor seed layer. The polycrystalline semiconductor seed layer may include polycrystalline semiconductor material such as, for example, polycrystalline silicon, SiGe, SiC, and/or Ge. The semiconductor seed layer is suitably deposited and annealed in the same reaction chamber as the layers of semiconductor material deposited and annealed during the cycling process.

The semiconductor seed layer suitably has a thickness less than the thickness of the semiconductor layer 110. In some embodiments, the semiconductor seed layer may have a thickness approximately equal to each of the layers of semiconductor material deposited and annealed during the cycling process. In some embodiments, the semiconductor seed layer may be deposited to a thickness of less than about 20 μm, less than about 10 μm, less than about 5 μm, less than about 3 μm, less than about 2 μm, less than about 1 μm, or less than about 0.5 μm, such as between about 50 nanometers (nm) and about 20 μm, or between about 50 nm and about 10 μm, or between about 50 nm and about 5 μm, or between about 50 nm and about 3 μm, or between about 50 nm and about 2 μm, or between about 50 nm and about 1 μm, or between about 50 nm and about 500 nm, or between about 50 nm and about 200 nm. The thickness of the semiconductor seed layer is set by the size of the semiconductor nuclei. To achieve effective stress release, the semiconductor seed layer needs to cover the substrate surface while leaving voids smaller than about 50 nm, which enables the access of hydrogen gas ($H_2$) to the interface between the semiconductor seed layer and oxide. Hydrogen gas reduces the interfacial oxide and promotes the diffusion of the atoms at the grain boundaries of the semiconductor seed layer to the substrate 100 and thus releases the film stress. When the semiconductor seed layer is thick enough to completely prevent $H_2$ access to the interfacial oxide, the subsequent annealing process is not able to release the film stress effectively. On the other hand, when the semiconductor seed layer is not continuous and the opening area between two adjacent nuclei is wider than about 50 nm, large nuclei are formed after the oxide layer is removed during the seed layer annealing process. The large nuclei will grow into large grains (i.e., diameter >1 μm) after the semiconductor layer 110 is deposited, which reduces the trapping efficiency.

The semiconductor seed layer is subjected to a high temperature anneal which is followed by the cycling process to deposit and anneal each of the layers of semiconductor material. Annealing the semiconductor seed layer contributes to desirable charge trapping layer properties, such as obtaining a clean surface, a high purity film, a high resistivity film, desired nuclei size and uniformity, and reduction of compressive film stress. In some embodiments, the semiconductor seed layer is subjected to a high temperature anneal in order to produce tensile stress in the semiconductor seed layer. The temperature at which the semiconductor seed layer is deposited is generally greater than the anneal temperature for each of the layers of semiconductor material annealed during the cycling process. For example, the semiconductor seed layer may be annealed at a temperature greater than about 1000° C., greater than about 1025° C., or greater than about 1050° C., such as between about 1000° C. and about 1200° C., between about 1000° C. and about 1100° C., between about 1025° C. and about 1050° C., or between about 1050° C. and about 1100° C. The semiconductor seed layer may be annealed for a duration between about 1 second and about 300 seconds, such as between about 5 seconds and about 60 seconds, or between about 10 seconds and about 40 seconds. The semiconductor seed layer may be annealed in an ambient atmosphere which may contain hydrogen, hydrogen chloride, chlorine, or any combination of hydrogen, hydrogen chloride, and chlorine. The semiconductor seed layer may be performed at reduced pressure or atmospheric pressure, such as between about 1

Torr and about 760 Torr, or between about 10 Torr and about 760 Torr. The grain size and the stress of the semiconductor seed layer is controlled by the annealing temperature, duration, and gas flow.

Because the semiconductor seed layer may be annealed at a relatively higher temperature, the example methods described herein may include cooling the single crystal semiconductor handle substrate 100 after annealing the semiconductor seed layer. For example, the example methods may include cooling the substrate 100 to a temperature less than about 1000° C. after annealing the semiconductor seed layer and prior to performing the cycling process of depositing a layer of semiconductor material, i.e., a portion of the semiconductor layer 110, and annealing the portion of the semiconductor layer 110. The cycling process is then initiated once the substrate 100 has cooled to the desired temperature.

In some embodiments, an oxide film may be formed on top of the deposited semiconductor layer 110. This may be accomplished by means known in the art, such as thermal oxidation (in which some portion of the deposited semiconductor material film will be consumed), CVD oxide deposition, and/or atomic layer deposition. For example, the semiconductor layer 110 may be thermally oxidized in a furnace such as an ASM A400 or an ASM A412. The temperature may range from about 750° C. to about 1200° C. in an oxidizing ambient. The oxidizing ambient atmosphere may be a mixture of inert gas, such as Ar or $N_2$, and $O_2$. The oxygen content may vary from 1 to 10 percent, or higher. In some embodiments, the oxidizing ambient atmosphere may be up to 100% oxygen (a "dry oxidation"). In some embodiments, the oxidizing ambient atmosphere may include oxygen and ammonia, which is suitable for depositing silicon oxynitride. In some embodiments, the ambient atmosphere may comprise a mixture of inert gas, such as Ar or $N_2$, and oxidizing gases, such as $O_2$ and water vapor (a "wet oxidation"). In some embodiments, the ambient atmosphere may comprise a mixture of inert gas, such as Ar or $N_2$, and oxidizing gas, such as $O_2$ and water vapor (a "wet oxidation"), and a nitriding gas, such as ammonia. In some embodiments, the ambient atmosphere may comprise a mixture of inert gas, such as Ar or $N_2$, and a nitriding gas, such as ammonia, which is suitable for depositing silicon nitride. Single crystal semiconductor handle substrates 100 having the semiconductor layer 110 formed on the front surface 102 thereof may be loaded into a vertical furnace, such as an ASM A400 or an ASM A412. The temperature is ramped to the oxidizing temperature with a mixture of $N_2$ and $O_2$. At a desired temperature water vapor may be introduced into the gas flow. After a desired oxide film thickness has been obtained, the water vapor and $O_2$ are turned off and the furnace temperature is reduced and substrates 100 are unloaded from the furnace. In some embodiments, the semiconductor layer 110 may be oxidized for a duration sufficient to provide an oxide layer of at least about 0.01 μm thick.

Figure 4:
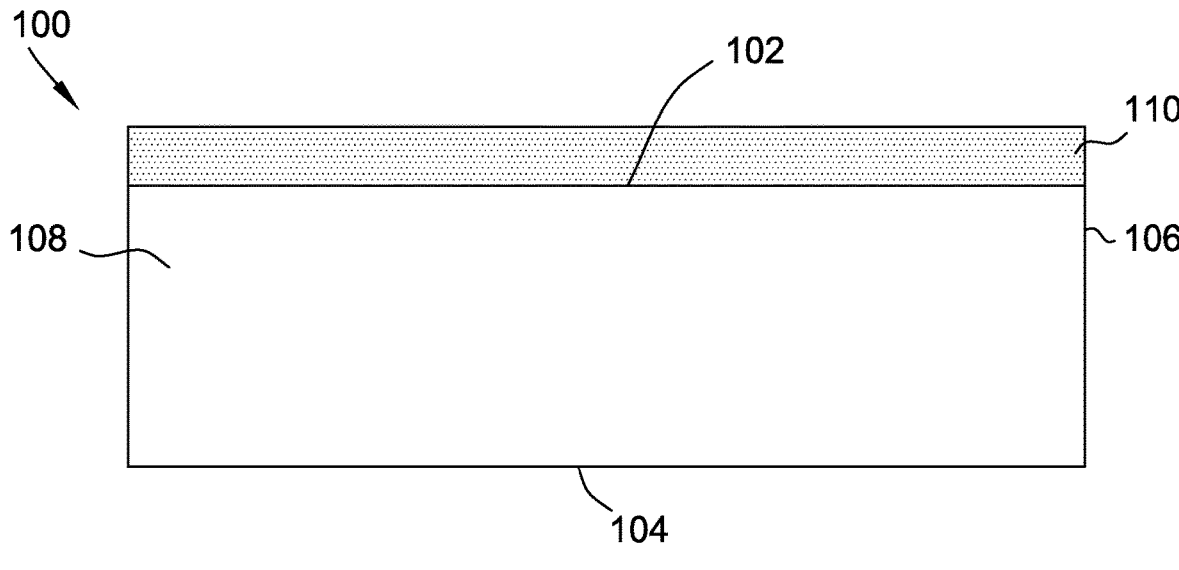
FIG. 4 is a depiction of a multilayer structure prepared in accordance with a method of the present disclosure, the multilayer structure including the handle substrate of FIG. 3 having a semiconductor charge trapping layer deposited on a front surface thereof.

In some embodiments, the semiconductor layer 110 produced as described above is subsequently planarized to reduce a surface roughness of the exposed surface of the semiconductor layer 110 and optimize warp and bow of the substrate 100 shown in FIG. 4 for subsequent operations in producing a semiconductor-on-insulator structure. For example, the semiconductor layer 110 may be subjected to a polishing operation, such as a chemical mechanical polishing ("CMP") operation. The semiconductor layer 110 may have a relatively rough surface. For example, the deposited semiconductor layer 110 may have a surface roughness as measured by $RMS_{2 \times 2 \mu m2}$ on the order of 50 nm. The semiconductor layer 110 may be subjected to a polishing operation to reduce the surface roughness, preferably to the level of less than about 5 Angstroms as measured by $RMS_{2 \times 2 \mu m2}$, such as between about 1 Angstrom and about 2 Angstroms, wherein root mean squared—

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point. At a surface roughness of preferably less than 2 Angstroms, the surface is ready for subsequent bonding operations described further below. In addition to polishing, cleaning of the substrate 100 having the semiconductor layer 110 is optional. If desired, the wafers can be cleaned, for example, in a standard SC1 and/or SC2 solution.

The single crystal semiconductor handle substrate 100 prepared according to the method described herein to include a semiconductor layer 110 (shown in FIG. 4), is next bonded a single crystal semiconductor donor substrate 200 (shown in FIG. 5), e.g., a single crystal semiconductor donor wafer, which includes a dielectric layer 210 formed on a front surface 202 thereof. Like the substrate 100, the single crystal semiconductor donor substrate 200 may be a single crystal semiconductor wafer. In some embodiments, the donor substrate 200 includes a semiconductor material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor substrate 200 may include a dopant selected from the group consisting of boron, arsenic, and phosphorus. The resistivity of the single crystal semiconductor (e.g., silicon) donor substrate 200 may range from 0.01 Ohm-cm to 500 Ohm-cm, such as 1 Ohm-cm to 100 Ohm-cm, 1 Ohm-cm to 50 Ohm-cm, typically, from 5 to 25 Ohm-cm. The single crystal semiconductor donor substrate 200 may be subjected to standard process steps including oxidation, implant, and post implant cleaning. Accordingly, a semiconductor donor substrate 200, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer or cleave plane 212 in the donor substrate 200.

As described above, the semiconductor donor substrate 200 may include a dielectric layer 210 formed on the front surface 202 thereof. Suitable dielectric layers 210 may comprise a material selected from among silicon dioxide, silicon nitride, hafnium oxide, titanium oxide, zirconium oxide, lanthanum oxide, barium oxide, and a combination thereof. In some embodiments, the dielectric layer 210 comprises an oxide layer having a thickness of at least about 10 nm thick, such as between about 10 nm and about 10,000 nm, between about 10 nm and about 5,000 nm, or between about 100 nm and about 800 nm.

In some embodiments, the front surface 202 of the single crystal semiconductor donor substrate 200 (e.g., a single crystal silicon donor substrate) may be thermally oxidized (in which some portion of the deposited semiconductor material film will be consumed) to prepare the dielectric layer 210 (e.g., a semiconductor oxide film, such as a silicon dioxide film), or the semiconductor oxide (e.g., silicon dioxide) film may be grown by CVD oxide deposition to form the dielectric layer 210. Oxidizing operations performed on the front surface 202 of the donor substrate 200 may be similar to those described above for the front surface 102 of the handle substrate 100. In some embodiments, the front surface 202 of the single crystal semiconductor donor substrate 200 may be thermally oxidized in a furnace such as an ASM A400 or an ASM A412 in the same manner described above. In some embodiments, the donor substrate 200 is oxidized to provide a dielectric layer 210 on the front surface 202 of at least about 10 nm thick, such as between about 10 nm and about 10,000 nm, between about 10 nm and about 5000 nm, or between about 100 nm and about 800 nm.

The semiconductor device layer 402 in a semiconductor-on-insulator composite structure 400 (shown in FIG. 7) is derived from the single crystal semiconductor donor substrate 200. The semiconductor device layer 402 may be transferred onto the semiconductor handle substrate 100 by wafer thinning techniques such as etching a semiconductor donor substrate 200 or by cleaving a semiconductor donor substrate 200 comprising a cleave plane 212.

The cleave plane 212 may be formed in the donor substrate 200 by ion implantation techniques. Ion implantation may be carried out in a commercially available instrument, such as an Applied Materials Quantum H. Implanted ions include He, H, $H_2$, or combinations thereof. Ion implantation is carried out as a density and duration sufficient to form the cleave plane 212 in the semiconductor donor substrate 200. Implant density may range from about $10^{12}$ ions/cm$^2$ to about $10^{17}$ ions/cm$^2$, such as from about $10^{14}$ ions/cm$^2$ to about $10^{17}$ ions/cm$^2$. Implant energies may range from about 1 keV to about 3,000 keV, such as from about 10 keV to about 3,000 keV. The depth of implantation determines the thickness of the single crystal semiconductor device layer 402 in the final semiconductor-on-insulator structure 400 (shown in FIG. 7). In some embodiments it may be desirable to subject the single crystal semiconductor donor substrate 200, to a cleaning operation after the implant. In some preferred embodiments, the clean may include a Piranha clean followed by a deionized water rinse and cleaning using a SC1 and/or SC2 solution.

In some embodiments, the single crystal semiconductor donor substrate 200 having an ion implant region therein formed by helium ion and/or hydrogen ion implant is annealed at a temperature sufficient to form a thermally activated cleave plane 212 in the donor substrate 200. An example of a suitable tool might be a simple Box furnace, such as a Blue M model. In some preferred embodiments, the ion implanted single crystal semiconductor donor substrate 200 is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane 212. After the thermal anneal to activate the cleave plane 212, the front surface 202, which may optionally include the dielectric layer 210, and optionally the back surface 204, of the single crystal semiconductor donor substrate 200 surface may be cleaned using cleaning operations described above.

In some embodiments, the ion-implanted and optionally cleaned and optionally annealed single crystal semiconductor donor substrate 200 is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor substrate 200 is loaded into the chamber. The chamber is evacuated and backfilled with $O_2$ to a pressure less than atmospheric to thereby create the plasma. The single crystal semiconductor donor substrate 200 is exposed to this plasma for the desired time, which may range from about 1 second to about 120 seconds. Oxygen plasma surface oxidation is performed in order to render the front surface 202, and optionally the dielectric layer 210 formed on the front surface 202, of the single crystal semiconductor donor substrate 200 hydrophilic and amenable to bonding to a single crystal semiconductor handle substrate prepared according to the method described above.

Figure 6:
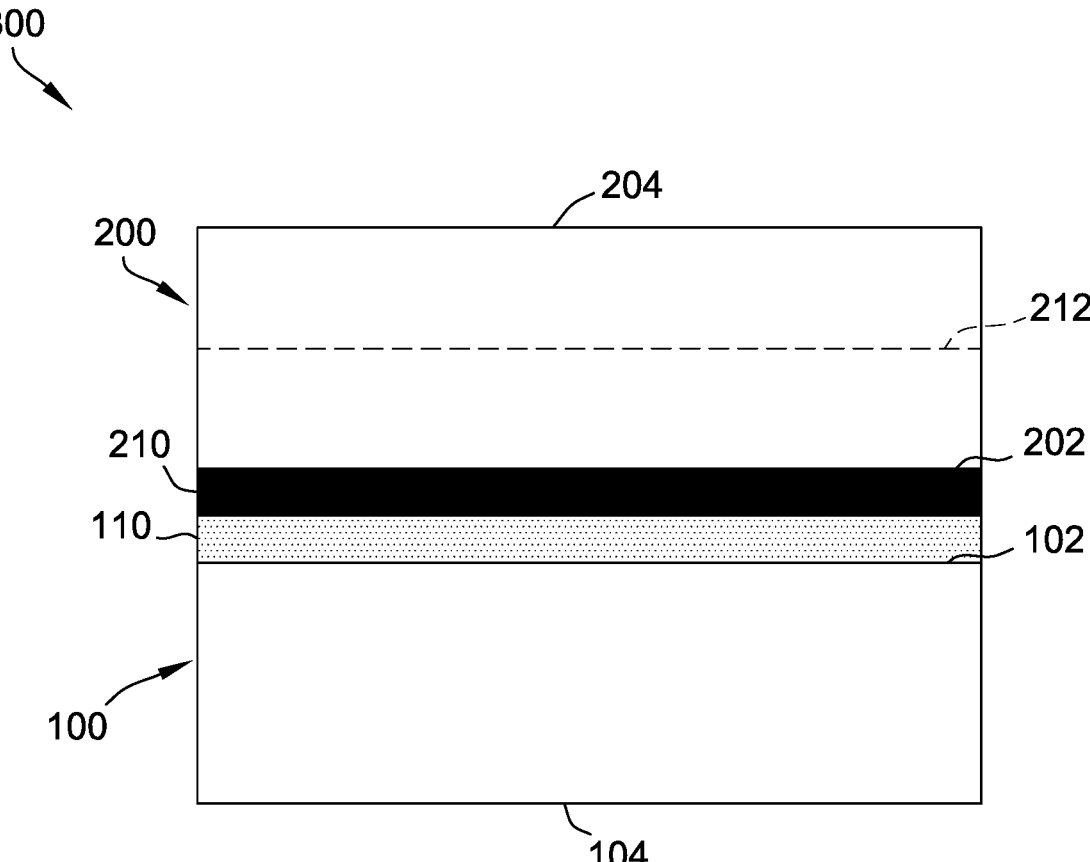
FIG. 6 is a depiction of a multilayer structure prepared in accordance with a method of the present disclosure, the multilayer structure including the dielectric layer of the donor substrate of FIG. 5 bonded to the semiconductor charge trapping layer deposited on the front surface of the handle substrate of FIG. 4.

Referring the FIG. 6, the hydrophilic front surface layer (e.g., the hydrophilic exposed surface of the dielectric layer 210) of the single crystal semiconductor donor substrate 200 and the exposed surface of the semiconductor layer 110 on the front surface 102 of the single crystal semiconductor handle substrate 100 are next brought into intimate contact to thereby form a bonded structure 300. In the illustrated embodiment, the bonded structure 300 comprises the dielectric layer 210, e.g., a buried oxide layer, contributed by the oxidized front surface 202 of the single crystal semiconductor donor substrate 200, in interfacial contact with the semiconductor charge trapping layer 110. In some embodiments, the dielectric layer 210, e.g., buried oxide layer, has a thickness of at least about 10 nm, such as between about 10 nm and about 10,000 nm, between about 10 nm and about 5000 nm, or between about 100 nm and about 800 nm.

Since the mechanical bond between the semiconductor charge trapping layer 110 and the dielectric layer 210 is relatively weak, the bonded structure 300 is further annealed to solidify the bond. In some embodiments, the bonded structure 300 is annealed at a temperature sufficient to form a thermally activated cleave plane 212 in the single crystal semiconductor donor substrate 200. An example of a suitable tool might be a simple Box furnace, such as a Blue M model. In some embodiments, the bonded structure 300 is annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours. Thermal annealing within these temperatures ranges is sufficient to form a thermally activated cleave plane 212. After the thermal anneal to activate the cleave plane 212, the bonded structure 300 may be cleaved to produce the final cleaved, composite structure 400 shown in FIG. 7.

After the thermal anneal of the bonded structure 300, the bond between the single crystal semiconductor donor substrate 200 and the single crystal semiconductor handle substrate 100 is strong enough to initiate layer transfer via cleaving the bonded structure 300 at the cleave plane 212. Cleaving may occur according to techniques known in the art. In some embodiments, the bonded structure 300 may be placed in a conventional cleave station affixed to stationary suction cups on one side (e.g., on one of the back surfaces 104, 204) and affixed by additional suction cups on a hinged arm on the other side (e.g., on another one of the back surfaces 104, 204). A crack is initiated near the suction cup attachment and the movable arm pivots about the hinge cleaving the donor substrate 200 apart. Cleaving removes a portion of the semiconductor donor substrate 200, thereby leaving a semiconductor device layer 402, preferably a silicon device layer, on the semiconductor-on-insulator composite structure 400 (shown in FIG. 7).

After cleaving, the cleaved structure 400 may be subjected to a high temperature anneal in order to further strengthen the bond between the transferred device layer 402 and the single crystal semiconductor handle substrate 100. An example of a suitable tool might be a vertical furnace, such as an ASM A400 or an ASM A412. In some preferred embodiments, the cleaved structure 400 is annealed at a temperature of from about 1000° C. to about 1200° C., preferably at about 1000° C. Thermal annealing may occur for a duration of from about 0.5 hours to about 8 hours. Thermal annealing within these temperatures ranges is sufficient to strengthen the bond between the transferred device layer 402 and the single crystal semiconductor handle substrate 100.

Figure 7:
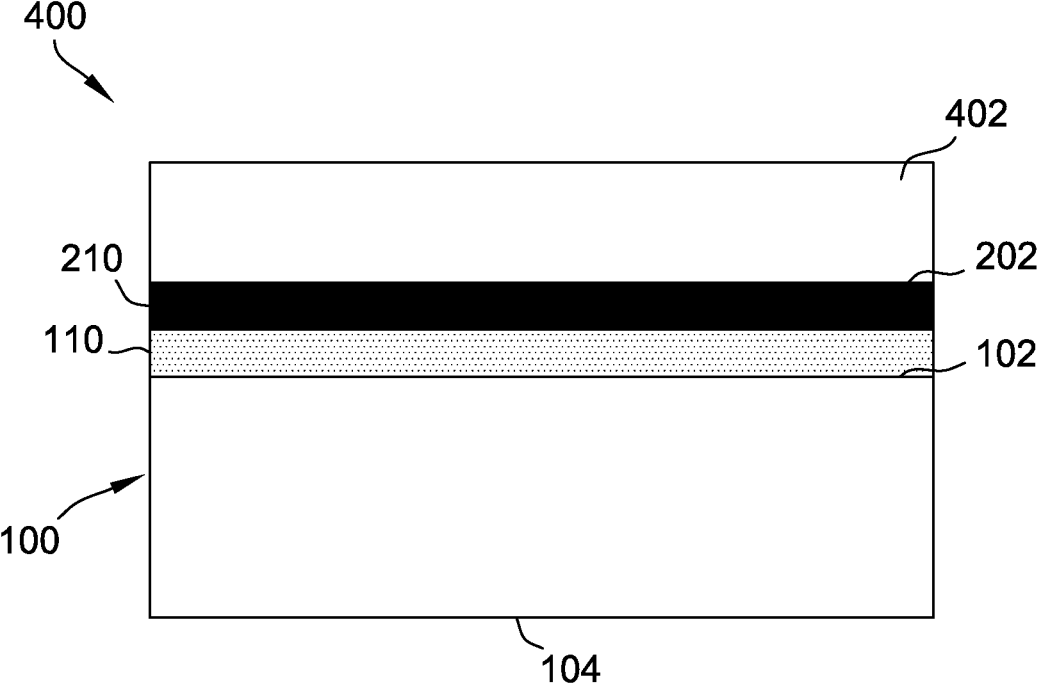
FIG. 7 is a depiction of a multilayer structure prepared in accordance with a method of the present disclosure, the multilayer structure including the handle substrate having a semiconductor charge trapping layer deposited on the front surface thereof, a dielectric layer, and a semiconductor device layer.

After the cleave and high temperature anneal, exposed surfaces (e.g., the exposed surface 104 and/or an exposed surface of the transferred device layer 402) of the cleaved structure 400 are sufficiently smooth as a result of the high temperature anneal. In some embodiments, an epitaxial layer (not shown) may be deposited on an exposed surface of the transferred device layer 402. With reference to FIG. 7, the finished multilayer structure 400, i.e., a semiconductor-on-insulator structure 400, comprises the high resistivity single crystal semiconductor handle substrate 100 (e.g., a single crystal silicon handle substrate), a semiconductor charge trapping layer 110, a dielectric layer 210 (e.g., a semiconductor oxide layer, such as a silicon dioxide layer, prepared from oxidation of the front surface 202 of the single crystal semiconductor donor substrate 200, and the semiconductor device layer 402 (prepared by cleaving and/or thinning the donor substrate 200). Oxidation may further be performed, for example, on the exposed surface 104 for reducing bow or warp of the structure 400. The final structure 400 may then be subjected to end of line metrology inspections and cleaned a final time using typical SC1-SC2 process.

The following non-limiting examples further illustrate the present invention.

Example 1. Comparison of Change in 3-Point Wafer Bow after Deposition of a Polycrystalline Semiconductor Layer for Varying Anneal Conditions A variety of low temperature anneal conditions for a deposited polycrystalline silicon layer were compared against a control where there was no post-deposition anneal. In one approach, a post-deposition anneal was performed for a duration after the polycrystalline silicon layer had been deposited and the temperature was maintained at the polycrystalline silicon layer deposition temperature. In another approach, the same duration of anneal was performed at the same temperature, but the annealing was distributed by intermittently pausing the deposition process according to the deposition-anneal cycling process disclosed herein. Specifically, 7 cycles of depositing a portion of the polycrystalline silicon layer and annealing the deposited portion of the polycrystalline silicon layer, for a total duration approximately equal to the deposition and anneal durations of the PDA approach, were performed. For each of the three conditions evaluated, a polycrystalline silicon seed layer with varying seed anneal times at a temperature above 1000° C. was formed prior to deposition of the polycrystalline silicon layer.

By annealing the polycrystalline silicon material intermittently during deposition, the distance to out-diffuse interstitial atoms from the grain boundaries is reduced and, as such, the time required for their removal is reduced. As a result, a wafer having acceptable levels of bow and warp is produced, which signals that the polycrystalline silicon layer has a desired level of tensile stress. The bow and warp levels may be higher than the those resulting from higher temperature anneals (e.g., greater than 1000° C.), but the intermittent, low temperature annealing operation provides the advantage of significantly reducing or eliminating crystallographic slip defect levels in the high resistivity substrate. In addition, enhanced bow and warp levels were achieved in the process where the polycrystalline silicon seed layer anneal time was increased. Further, performing intermittent anneals during the polycrystalline silicon deposition was shown to be more effective at reducing 3-point wafer bow than a single post-deposition anneal step of the same duration.

Figure 8:
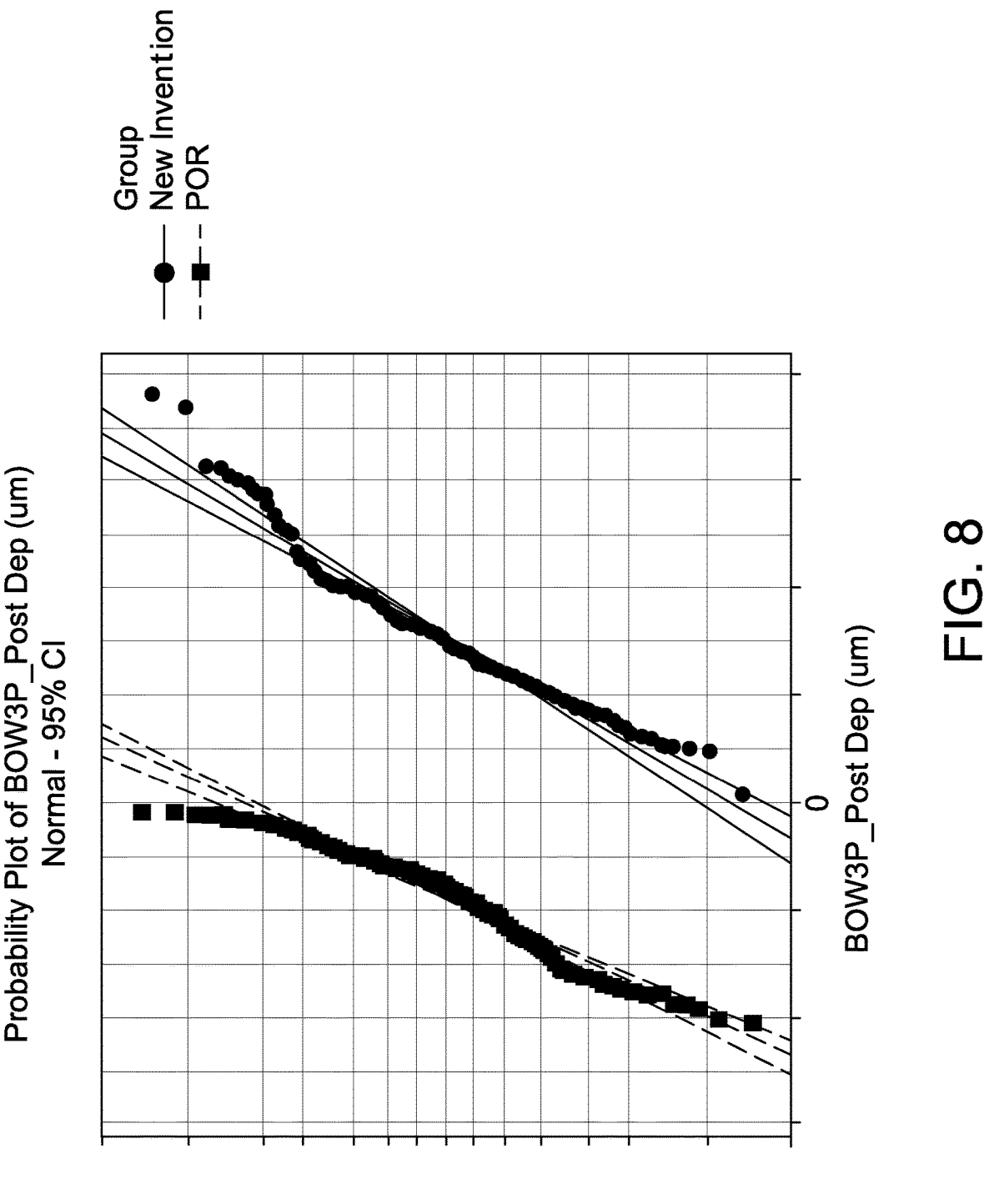
FIG. 8 shows probability plots comparing a change in 3-point wafer bow after deposition of a polycrystalline semiconductor layer with a single post-deposition anneal and after deposition of a polycrystalline semiconductor layer during which intermittent anneals are performed.
Figure 9:
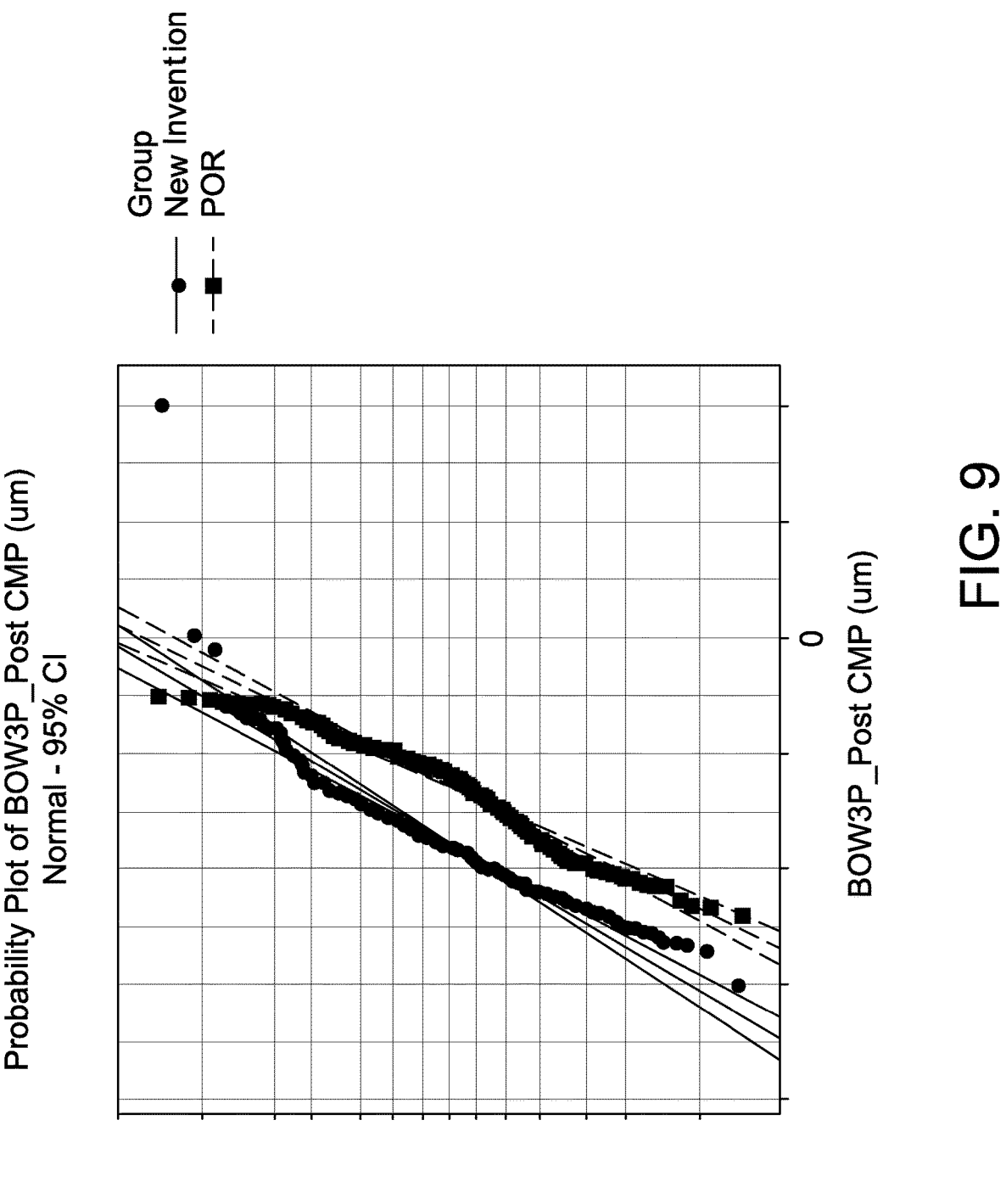
FIG. 9 shows probability plots comparing a change in 3-point wafer bow after deposition of a polycrystalline semiconductor layer with a single post-deposition anneal and after deposition of a polycrystalline semiconductor layer during which intermittent anneals are performed, where the deposited polycrystalline semiconductor layers have been polished.

FIGS. 8 and 9 compare the 3-point wafer bow difference post-deposition of the polycrystalline silicon layer after a higher temperature, post-deposition anneal (labeled POR) and after an intermittent, low temperature anneal in accordance with the present disclosure (labeled New Invention). As shown in FIG. 8, when comparing the post-deposition data for the high temperature anneal and the new intermittent anneal process, the new intermittent anneal process shows higher compressive stress (positive bow values) than the POR process (tensile stress, negative bow values, in the POR wafers). However, as shown in FIG. 9, after a subsequent CMP process, more negative bow (more tensile stress) is observed in the new intermittent anneal process, which helps to better balance the compressive stress induced by a buried oxide layer and reduce the final semiconductor-on-insulator wafer bow and warpage.

Figure 10:
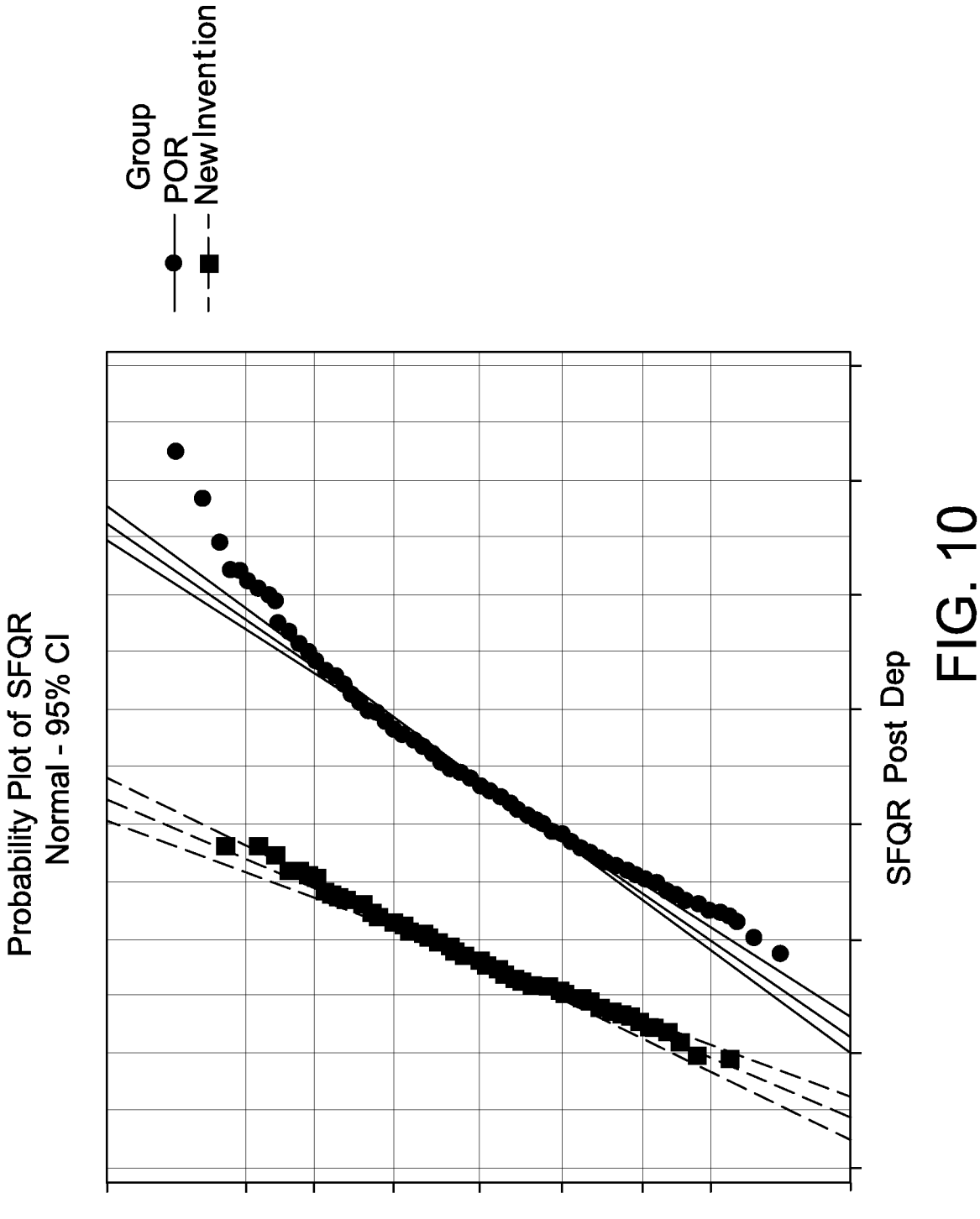
FIG. 10 shows probability plots comparing wafer SFQR after deposition of a polycrystalline semiconductor layer with a single post-deposition anneal and after deposition of a polycrystalline semiconductor layer during which intermittent anneals are performed.

Example 2. Comparison of Wafer SFQR after Deposition of a Polycrystalline Semiconductor Layer for Varying Anneal Conditions A comparison of the approaches described above in Example 1 was also performed for site flatness of the post-deposition wafers. In addition to controlling the post-deposition 3-point wafer bow and crystallographic slip, it is also important to control the increase in site flatness (measured as SFQR) during polycrystalline silicon deposition. During polycrystalline silicon processing, polycrystalline silicon is intentionally deposited on the front side of the handle wafer. However, because the reaction chamber is filled with reactant, it can also diffuse around the edge of the wafer and deposit on the backside of the handle wafer. Frequently, the backside deposition is not uniform, and so the SFQR site flatness measurement is degraded. While all conditions tested showed some improvement in SFQR with increased seed layer anneal time, post-deposition wafers produced with the intermittent pauses and anneals during deposition showed the greatest improvement in site flatness, specifically at the edge sites where site flatness is worst. When comparing the result of the new intermittent anneal process with a high temperature, post-deposition anneal process, the SFQR result are significantly better for the intermittent deposition process, as shown in FIG. 10.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," "front," back," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method of preparing a multilayer structure, the method comprising:

providing a single crystal semiconductor handle substrate, the single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane between the front and back surfaces of the single crystal semiconductor handle substrate, wherein the single crystal semiconductor handle substrate has a minimum bulk region resistivity of at least about 500 Ohm-cm; and depositing a semiconductor layer on the front surface of the single crystal semiconductor handle substrate, wherein depositing the semiconductor layer is performed by two or more cycles of depositing a portion of the semiconductor layer and interrupting the deposition after the portion of the semiconductor layer has been deposited to anneal the portion of the semiconductor layer, wherein depositing the semiconductor layer further comprises depositing a semiconductor seed layer and annealing the semiconductor seed layer prior to performing the two or more cycles of depositing the portion of the semiconductor layer and interrupting the deposition after the portion of the semiconductor layer has been deposited to anneal the portion of the semiconductor layer, and wherein the annealing the semiconductor seed layer is performed at a temperature greater than 1000° C. and the annealing during the two or more cycles is performed at a temperature less than 1000° C.

2. The method of claim 1, wherein a cycle of the depositing the semiconductor layer comprises:

depositing the portion of the semiconductor layer at a deposition temperature; and annealing the portion of the semiconductor layer at an anneal temperature.

3. The method of claim 2, wherein the deposition temperature and the anneal temperature are within 10° C. of each other.

4. The method of claim 2, wherein the deposition temperature and the anneal temperature during the two or more cycles are each between 850° C. and 1000° C.

5. The method of claim 1, wherein depositing the semiconductor layer is performed by between three and ten cycles of depositing the portion of the semiconductor layer and interrupting the deposition after the portion of the semiconductor layer has been deposited to anneal the portion of the semiconductor layer.

6. The method of claim 1, wherein each cycle of the depositing the semiconductor layer produces a respective portion of the semiconductor layer having a thickness of between 0.05 micrometers and 5 micrometers.

7. The method of claim 1, further comprising planarizing the semiconductor layer after depositing the semiconductor layer.

8. The method of claim 1, wherein the semiconductor layer comprises a polycrystalline or amorphous semiconductor material selected from the group consisting of silicon, silicon germanium (SiGe), silicon carbide (SiC), and germanium (Ge).

9. The method of claim 1, further comprising:

bonding an exposed front surface layer of a single crystal semiconductor donor substrate to the semiconductor layer, the exposed front surface layer of the single crystal semiconductor donor substrate comprising a dielectric layer, the single crystal semiconductor donor substrate comprising two major, generally parallel surfaces, one of which is a front surface of the single crystal semiconductor donor substrate and the other of which is a back surface of the single crystal semiconductor donor substrate, a circumferential edge joining the front and back surfaces of the single crystal semiconductor donor substrate, and a central plane between the front and back surfaces of the single crystal semiconductor donor substrate, the single crystal semiconductor donor substrate further comprising a cleave plane, to thereby form a bonded structure comprising the single crystal semiconductor handle substrate, the semiconductor layer, the dielectric layer, and the single crystal semiconductor donor substrate; and cleaving the bonded structure at the cleave plane to thereby form a cleaved structure comprising the single crystal semiconductor handle substrate, the semiconductor layer, the dielectric layer, and a single crystal semiconductor device layer.

10. A method of preparing a multilayer structure, the method comprising:

providing a single crystal semiconductor handle substrate, the single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane between the front and back surfaces of the single crystal semiconductor handle substrate, wherein the single crystal semiconductor handle substrate has a minimum bulk region resistivity of at least about 500 Ohm-cm;

depositing a polycrystalline semiconductor seed layer on the front surface of the single crystal semiconductor handle substrate;

annealing the polycrystalline semiconductor seed layer;

depositing a first layer of polycrystalline semiconductor material on the annealed polycrystalline semiconductor seed layer at a deposition temperature; and annealing the first layer of polycrystalline semiconductor material at a temperature that is less than a temperature at which the polycrystalline semiconductor seed layer is annealed.

11. The method of claim 10, wherein the polycrystalline semiconductor seed layer is annealed at a temperature greater than 1000° C. and the first layer of polycrystalline semiconductor material is annealed at a temperature less than 1000° C.

12. The method of claim 10, further comprising:

depositing the first layer of polycrystalline semiconductor material at a deposition temperature; and annealing the first layer of polycrystalline semiconductor material at an anneal temperature that is less than the temperature at which the polycrystalline semiconductor seed layer is annealed.

13. The method of claim 12, wherein the deposition temperature and the anneal temperature are within 10° C. of each other.

14. The method of claim 12, wherein the deposition temperature and the anneal temperature are each between 850° C. and 1000° C.

15. The method of claim 10, further comprising:

depositing a second layer of polycrystalline semiconductor material on the annealed first layer of polycrystalline semiconductor material;

annealing the second layer of polycrystalline semiconductor material at a temperature that is less than the temperature at which the polycrystalline semiconductor seed layer is annealed;

depositing a third layer of polycrystalline semiconductor material on the annealed second polycrystalline semiconductor layer; and annealing the third layer of polycrystalline semiconductor material at a temperature that is less than the temperature at which the polycrystalline semiconductor seed layer is annealed.

16. The method of claim 15, wherein each of the first, second, and third layers of polycrystalline semiconductor material has a thickness of between 0.05 micrometers and 5 micrometers.

17. The method of claim 10, wherein the first layer of polycrystalline semiconductor material comprises a semiconductor material selected from the group consisting of silicon, silicon germanium (SiGe), silicon carbide (SiC), and germanium (Ge).

18. The method of claim 10, further comprising:

bonding an exposed front surface layer of a single crystal semiconductor donor substrate to a charge trapping layer of the single crystal semiconductor handle substrate comprising the first layer of polycrystalline semiconductor material, the exposed front surface layer of the single crystal semiconductor donor substrate comprising a dielectric layer, the single crystal semiconductor donor substrate comprising two major, generally parallel surfaces, one of which is a front surface of the single crystal semiconductor donor substrate and the other of which is a back surface of the single crystal semiconductor donor substrate, a circumferential edge joining the front and back surfaces of the single crystal semiconductor donor substrate, and a central plane between the front and back surfaces of the single crystal semiconductor donor substrate, the single crystal semiconductor donor substrate further comprising a cleave plane, to thereby form a bonded structure comprising the single crystal semiconductor handle substrate, the charge trapping layer, the dielectric layer, and the single crystal semiconductor donor substrate; and cleaving the bonded structure at the cleave plane to thereby form a cleaved structure comprising the single crystal semiconductor handle substrate, the charge trapping layer, the dielectric layer, and a single crystal semiconductor device layer.

* * * * *